United States Patent

Matsui et al.

[11] Patent Number: 5,851,846
[45] Date of Patent: Dec. 22, 1998

[54] POLISHING METHOD FOR SOI

[75] Inventors: Masaki Matsui, Nagoya; Masatake Nagaya, Nishikamo-gun; Akinari Fukaya, Obu; Hiroaki Himi, Nagoya, all of Japan

[73] Assignee: Nippondenso Co., Ltd., Kariya, Japan

[21] Appl. No.: 576,593

[22] Filed: Dec. 21, 1995

[30] Foreign Application Priority Data

Dec. 22, 1994 [JP] Japan ................................. 6-319832
Nov. 2, 1995 [JP] Japan ................................. 7-286171

[51] Int. Cl.⁶ .................................................. H01L 21/66
[52] U.S. Cl. .............................. 438/17; 438/5; 438/13; 438/659; 438/692; 216/52; 451/288
[58] Field of Search ........................ 438/5, 13, 14, 438/15, 17, 692, 659, 142, 388; 216/52; 451/288

[56] References Cited

U.S. PATENT DOCUMENTS

| 5,036,630 | 8/1991 | Kaanta et al. .......................... 51/283 |
| 5,084,419 | 1/1992 | Sakao . | |
| 5,196,353 | 3/1993 | Sandhu et al. . | |
| 5,437,762 | 8/1995 | Ochiai et al. . | |
| 5,486,129 | 1/1996 | Sandhu et al. ............................ 451/5 |

FOREIGN PATENT DOCUMENTS

| 616 362 | 9/1994 | European Pat. Off. . |
| 63-035390 | 7/1988 | Japan . |
| 3-104224 | 5/1991 | Japan . |
| 4-373121 | 12/1992 | Japan . |
| 5-291219 | 11/1993 | Japan . |
| 6-170728 | 6/1994 | Japan . |
| 7-024708 | 1/1995 | Japan . |

*Primary Examiner*—John Niebling
*Assistant Examiner*—Long Pham
*Attorney, Agent, or Firm*—Cushman Darby & Cushman IP Group of Pillsbury Madison & Sutro LLP

[57] ABSTRACT

In a dielectric isolation substrate, an end point of a polishing process for selective polishing for forming an SOI layer is detected with a high precision. When polishing a wafer with a polishing pad, the temperature of a region of the polishing pad having polished the wafer at a position immediately thereafter is detected by a temperature sensor and the selective polishing process is ended by discriminating that the rate of variation in the detected temperature has changed from a positive to a negative state and then to a fixed saturated state.

24 Claims, 15 Drawing Sheets

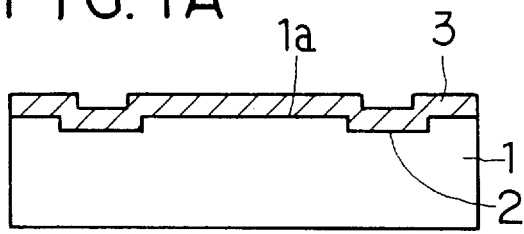
FIG. IA
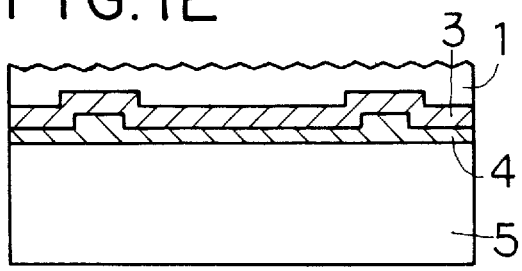
FIG. IE
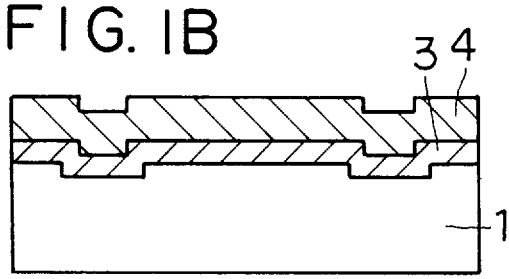
FIG. IB
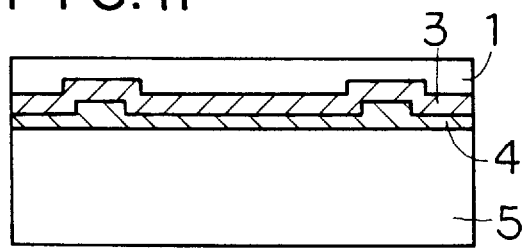
FIG. IF
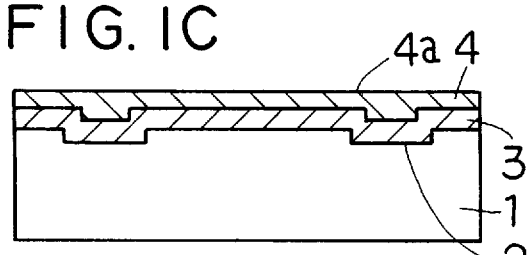
FIG. IC
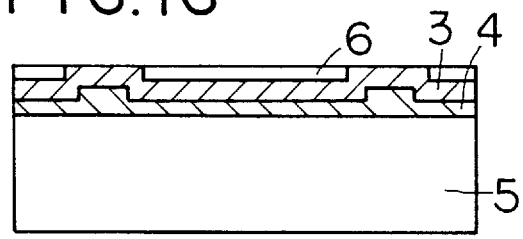
FIG. IG
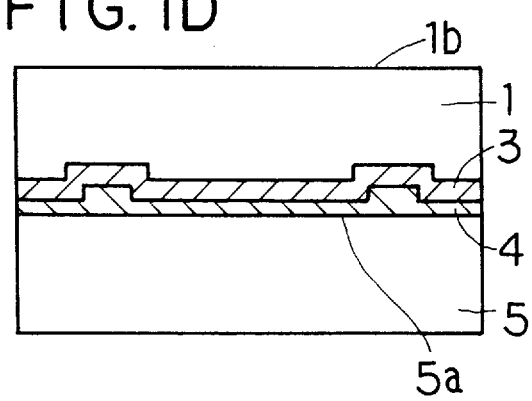
FIG. ID (a)

F I G. 16
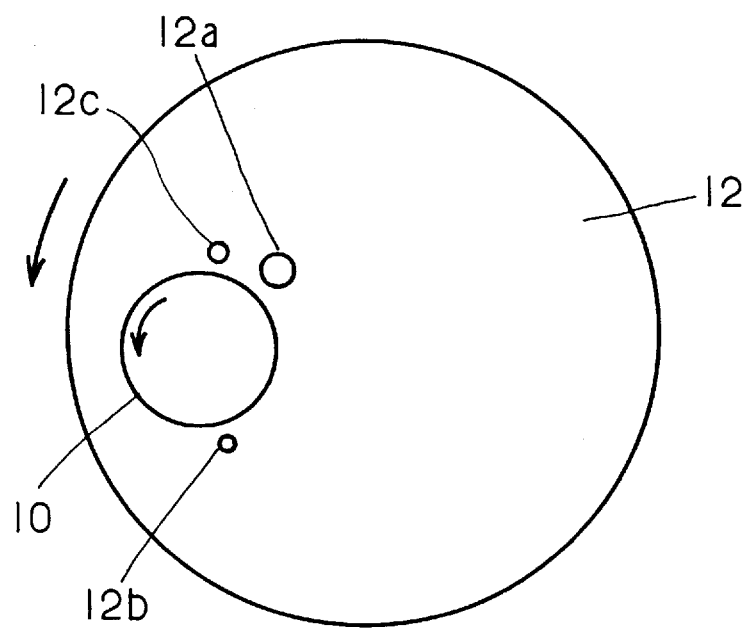

POLISHING METHOD FOR SOI

CROSS REFERENCE TO RELATED APPLICATION

This application is based upon and claims the benefit of priority of the prior Japanese Patent Applications No. 6-319832 filed on Dec. 22, 1994, No. 7-286171 filed on Nov. 2, 1995, the contents of which are incorporated herein by reference.

BACKGROUND OF THE INVENTION

1. Field of the Invention

The present invention relates to a polishing method for polishing an SOI (Silicon On Insulator) substrate or the like and a method for manufacturing a semiconductor substrate by use of this polishing method and, more particularly, to a substrate bonding technique and a method for manufacturing a thin film SOI substrate by use of selective polishing.

2. Related Arts

As a manufacturing method for manufacturing an SOI substrate, a method of bonding two silicon substrates to each other with an insulator film such as a silicon dioxide film interposed therebetween and polishing one of these substrates down to a prescribed thickness from the surface thereof to thereby form an SOI layer is known. However, there has been the problem that when attempting to form a thin SOI layer 0.5 μm or less in thickness, the variation in the thickness of SOI layer increases because of the limitations in polishing precision. As a result, a desired semiconductor device can not be formed.

Meanwhile, as a method for forming such a thin SOI layer with excellent thickness precision, the method illustrated in, for example, FIGS. 17A to 17C is known.

To explain the outline of this method, after forming a recess 2 in a mirror surface 1a of a first semiconductor substrate (single crystal silicon) 1, a silicon dioxide insulator film 3 is deposited and subsequently a polycrystalline silicon 4 is deposited (FIG. 17A). Thereafter, the polycrystalline silicon 4 is polished and planarized and a second semiconductor substrate (single crystal silicon) 5 is bonded to the polished surface thereof (FIG. 17B). Then, the other surface of the first semiconductor substrate 1 is ground and polished. During this polishing process, wherein the silicon dioxide film 3 formed in the recess 2 is made to function as a polishing stopper, i.e. selective polishing, whereby a thin film SOI substrate with minimum variation in the thickness of the SOI layer 6 can be obtained (FIG. 17C).

In this method, since selective polishing is performed by causing the insulator film 3 such as a silicon dioxide film to function as a stopper, the precision of and variation in the thickness of the SOI layer 6 can be improved compared to ordinary polishing performed without using a stopper.

However, although the polishing rate of the insulator film 3 as a stopper is low when compared with that of silicon, since the insulator film 3 and silicon are simultaneously polished, as the polishing time increases after the insulator film 3 has been exposed, the thickness of the SOI film 6 becomes less than the desired thickness. Also, the longer the polishing time period, the more the polishing unevenness of the SOI layer 6 occurs with the result that the variation in thickness thereof increases. The larger the area of the SOI layer 6 becomes, the more prominent this tendency.

Accordingly, it is necessary to end the polishing process when in an entire surface of the substrate all the portions of the insulator film 3 as a stopper have been exposed on the surface thereof for the purpose of decreasing the variation in thickness of the SOI layer 6.

However, a polished state thereof, that is, an exposed state of the insulator film 3, cannot be confirmed by directly observing the polished surface during the polishing process. This requires the performance of repeated polishing operations in such a manner that after having performed polishing for a short period of time, the substrate is removed from the polishing device and the polished state thereof confirmed, then the substrate is polished again and the polished state thereof is reconfirmed. This raises the problem of the necessity of a great deal of time and labor.

Also, even when polishing materials other than the above-mentioned SOI substrate, selective polishing for polishing a material to be polished by using as a stopper a material whose polishing rate is lower than the material to be polished incurs the problem that it is similarly impossible to detect an end point of the polishing process.

The following examples can be taken as such selective polishing.

FIGS. 18A to 18C and FIGS. 19A to 19C illustrate examples of a method for dielectric isolation of a semiconductor substrate 40. In the case of forming a dielectric isolation region by forming a groove portion (trench) 40a in the semiconductor substrate 40 and filling an insulator material therein, selective polishing of a silicon dioxide film 42 or deposited material 421 is performed using as a stopper a nitride film 41 formed on the surface of the substrate prior to filling. In some cases, a metal film 43 is used as the stopper.

FIGS. 20A to 20B illustrate an example of a wiring technique for wiring semiconductor devices. A groove portion or bore portion (recess portion) 51 is formed in an insulator film 52 and a metal film 53 such as Cu or W is embedded therein. Thereafter, selective polishing is performed on the metal film 53 by using the insulator film 52 as a stopper.

Further, in addition to the above-mentioned case of selective polishing, where planarizing the surface of an interlayer dielectric film by polishing as a multi-layer wiring technique for a semiconductor substrate, the problem it is impossible to detect the end point of the polishing process. Namely, as illustrated in FIG. 21A, when depositing an insulator film (silicon dioxide film) 62 over a wiring pattern 61 on a semiconductor substrate (silicon) 60, irregularities occur on the surface of the insulator film 62. Even when this surface of the insulator film 62 is planarized by polishing in the process step of FIG. 21B, it is difficult to detect an end point (a point in time at which the planarization of the surface to be polished as a whole has been completed) of the polishing process. Although the polishing process is at present performed through time management, since the polishing rate varies due to, for example, how worn the polishing pad is, there is the problem that stable planarization by means of a polishing process is impossible.

SUMMARY OF THE INVENTION

The present invention has been made in view of the above-mentioned problems and an object thereof is to perform the end point detection of a polishing process when the above-mentioned polishing processes are performed.

The inventors of the present invention have experimentally discovered that the behavior of variation in temperature of a polishing pad during a polishing process differs according to the kind of a material to be polished, and have conceived a method for performing the end point detection of a polishing process by utilizing the variation in temperature of the polishing pad. Namely, the present invention is characterized in that in a polishing process performed with the use of a polishing pad, the temperature of a portion of this polishing pad having polished a surface to be polished at a point in time immediately thereafter is measured and end point detection of the polishing process is performed according to variations in the temperature thus measured.

Accordingly, it is possible to perform end point detection of a polishing process without performing the operations of, for example, detaching the substrate from the polishing machine and confirming the polished state thereof during the polishing process.

In this case, since a portion of the polishing pad having polished a surface to be polished is measured at a point in time immediately thereafter, it is possible to perform end point detection of the polishing process with high precision without the effect of temperature variations at different points of the polishing pad.

BRIEF DESCRIPTION OF THE DRAWINGS

These and other objects, features and characteristics of the present invention will be appreciated from a study of the following detailed description, the appended claims, and drawings, all of which form a part of this application. In the drawings:

FIGS. 1A through 1G are sectional views illustrating SOI substrates in the manufacturing process steps in the case of forming an SOI layer in an embodiment of the present invention;

FIG. 16 is a view illustrating a state where a portion of a polishing pad having polished a substrate at a point in time immediately prior thereto and a portion thereof at a point in time immediately thereafter are simultaneously measured;

DETAILED DESCRIPTION OF THE PRESENTLY PREFERRED EXEMPLARY EMBODIMENTS

An explanation will now be given of a method of detecting the end point of polishing by variations in temperature of a polishing pad during a polishing process, on the basis of the results of experiments performed by the present inventors.

Figure 2A:
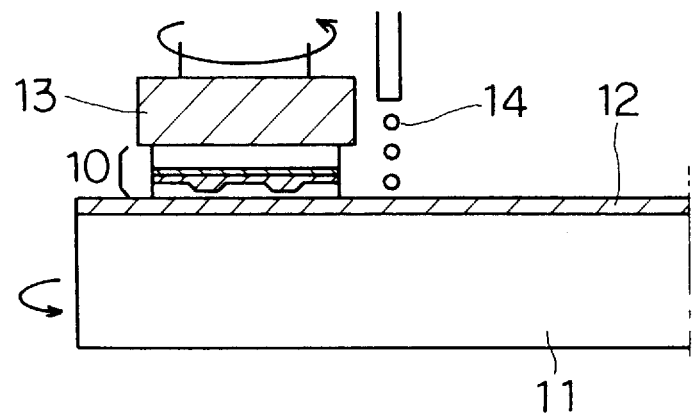
FIGS. 2A and 2B are respectively a side view and a plan view which respectively illustrate a schematic construction of a polishing device and a state of polishing operation.
Figure 2B:
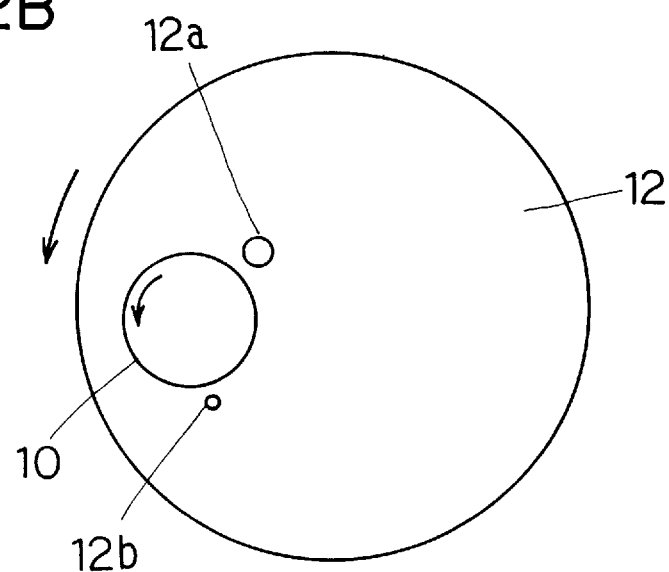

FIG. 2A illustrates the construction of a polishing device used when selective polishing is performed. FIG. 2B illustrates a state where a wafer is polished with the use of the polishing device.

In FIG. 2A, a polishing pad 12 is adhered onto a turn table 11. Also, a wafer 10 with respect to which selective polishing is to be performed is mounted on a chuck table 13, and the resulting wafer is mounted on the polishing pad 12. The turn table 11 and chuck table 13 are rotated (the chuck table 13 is rotated by means of a drive unit not illustrated) while dropping a polishing slurry 14 onto a position 12a of FIG. 2B at which the polishing slurry is to dropped, whereby the wafer 10 is polished by the polishing pad 12.

The present inventors performed their experiment on the temperature variations of the polishing pad 12 when the polishing process was performed with the use of this polishing device.

Polishing slurry 'Nalco 2350 (trade name)' which was made to have a grinding particle density of 0.05 wt % and a temperature of 25° C. was used as the polishing slurry 14. Also, 'Suba 600 (trade name)' was used as the polishing pad 12 and was adhered to the turn table 11, the temperature of which was adjusted to 20° C., to perform the polishing process. The speed of rotation of the turn table 1 was set at 60 rpm. Note that the polishing slurry 14 used in this experiment was made to have a grinding particle density lower than that of a polishing slurry used in ordinary polishing. This is for the purpose of allowing a silicon dioxide film 3 to function as a stopper by decreasing the polishing rate thereof and preventing the occurrence of polishing unevenness of an SOI layer 6 by decreasing the polishing rate of the silicon.

The temperature of the polishing pad 12 during selective polishing is detected at a portion of the polishing pad 12 where the wafer 10 has been polished, that is, at a portion (a temperature measuring point 12b of FIG. 2B) of the polishing pad 12 immediately after contact thereof with the wafer 10. Note that in a case where selective polishing is performed while the position of the wafer 10 on the polishing pad 12 is being moved relative to the polishing pad 12, the position of the temperature measuring point 12b is moved accordingly. In order to perform the above-mentioned temperature detection, a non-contact type temperature sensor is used which measures the radiation energy at the temperature measuring point in a non-contact manner and converts it to a temperature measurement.

Also, in this experiment, the thickness of the silicon layer on the silicon dioxide film 3 which is to become the stopper prior to start of selective polishing is made to be 0.8 μm.

Figure 3:
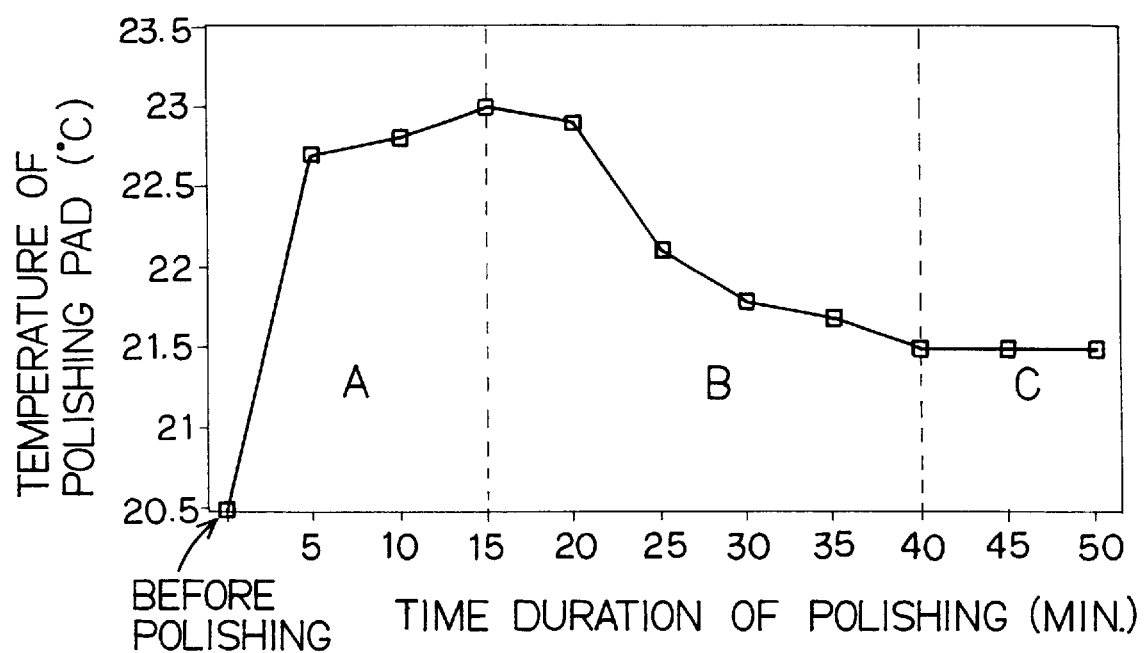
FIG. 3 is a graph showing the experimental results of variations in temperature of a polishing pad during a polishing process.
Figure 4A:
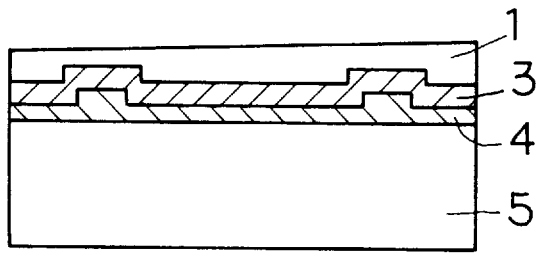
FIGS. 4A through 4C and FIGS. 5A through 5C are respectively sectional views illustrating process steps of a selective polishing and plan views illustrating wafers corresponding thereto.
Figure 5A:
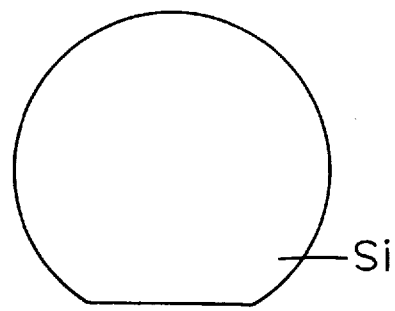
Figure 4B:
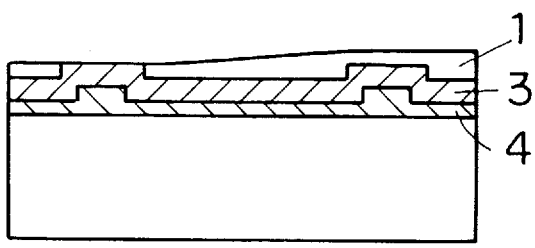
Figure 5B:
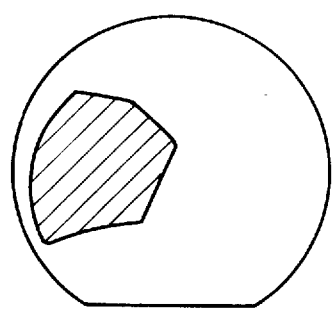
Figure 4C:
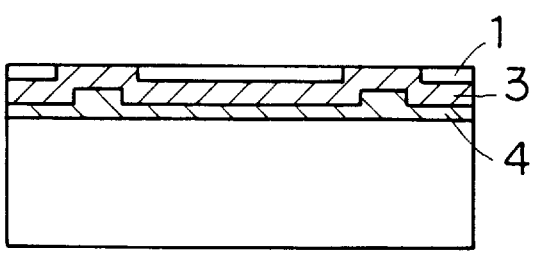
Figure 5C:
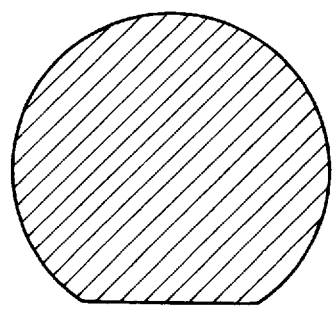

The result of this experiment is shown in FIG. 3. As shown in FIG. 3, the temperature of 20.5° C. when polishing is started rises up to 23.3° C. after 15 minutes and thereafter does not vary (region A). In this state, the silicon dioxide film 3 as a stopper is not exposed and the silicon is polished over the entire surface of the substrate (the state illustrated in FIGS. 4A and 5A). Thereafter, after 15 minutes, the temperature drops, that is, the rate of change in temperature relative to the lapse of time becomes negative (region B). This indicates that, as illustrated in FIGS. 4B and 5B, part of the silicon dioxide film begins to be exposed. Then, after 40 minutes, the temperature becomes unvaried at a fixed value, that is, the rate of temperature change falls within a prescribed range around zero (region C). This indicates that the silicon dioxide film has become exposed over the entire surface of the wafer (FIGS. 4C and 5C). This fixed point becomes a terminal or end point of the selective polishing, that is, a point in time at which the selective polishing is to be terminated. Note that FIGS. 4A to 4C illustrate sectional states of the wafer corresponding to the regions A, B and C (FIG. 3) and FIGS. 5A to 5C illustrate upper surface states of the wafer corresponding to FIGS. 4A to 4C.

It can be proven from the following experiment as well that when the silicon dioxide film becomes exposed on the surface of the wafer, the temperature of the polishing pad decreases. A non-processed silicon wafer having no silicon dioxide film formed on its surface and a wafer having a silicon dioxide film formed on its surface by thermal oxidation were prepared, and polishing was performed under the same conditions as in the case of the above-mentioned experiment. The results are shown in FIG. 6.

Figure 6:
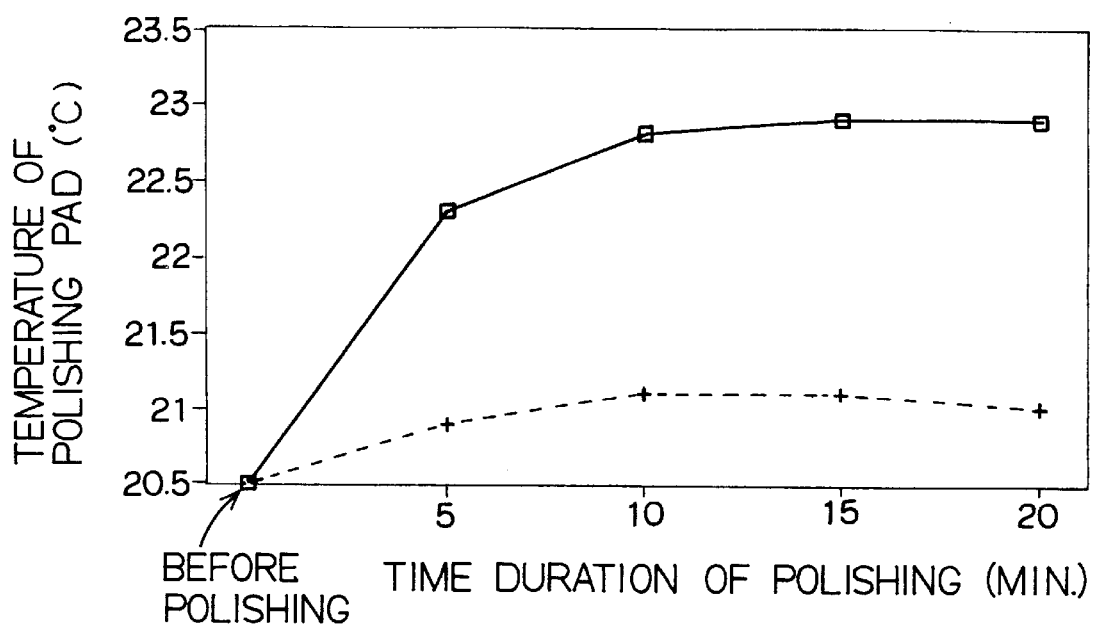
FIG. 6 is a graph showing the experimental results of the temperature of a polishing pad for polishing nonprocessed silicon and a wafer having an oxidized layer formed on its surface.

When the non-processed silicon wafer is polished, as indicated by a solid line in FIG. 6, the temperature of the polishing pad rises to 23° C. and then becomes unvaried. This state of temperature corresponds to one in the region A of FIG. 3. On the other hand, when the wafer having a silicon dioxide film formed on its surface is polished, as indicated by a broken line in FIG. 6, the temperature of the polishing pad becomes unvaried at 21° C. which is lower than in the case of the non-processed silicon wafer. This state of temperature approximately corresponds to one in the region C of FIG. 3. Note that in region C of FIG. 3 the surface of the wafer is not entirely the silicon dioxide film and silicon regions (SOI regions) co-exist thereon.

It can be seen from the results of this experiment that even if polishing is performed under the same conditions, the temperature of the polishing pad during the polishing process exhibits the difference between polishing silicon and polishing silicon dioxide film and is higher by around 2° C. in the polishing of silicon than in the polishing of silicon dioxide. The reason for this is as follows. The friction heat generated between the polishing pad and the surface (silicon, oxidized film) to be polished differs in the case of polishing silicon and in the case of polishing the silicon dioxide film. In addition, the polishing speed of oxidized film is much lower than that of silicon. Therefore, the reaction heat generated between the polishing slurry and the surface to be polished differs between when silicon is polished and when silicon dioxide film is polished (the reaction heat when silicon is polished is greater).

Accordingly, it is possible to detect the end point of selective polishing by utilizing the temperature difference of the polishing pad 12. Namely, in the case of selective polishing, when the silicon dioxide film begins to be exposed, the temperature of the polishing pad begins to decrease. When the silicon dioxide film has become exposed over the entire surface of the wafer, the temperature of the polishing pad becomes fixed. The end point of polishing can be determined by this temperature fixation. In other words, when the temperature of the polishing pad is in a saturated state, the amount of heat generated during polishing is also in a saturated state.

Figure 18A:
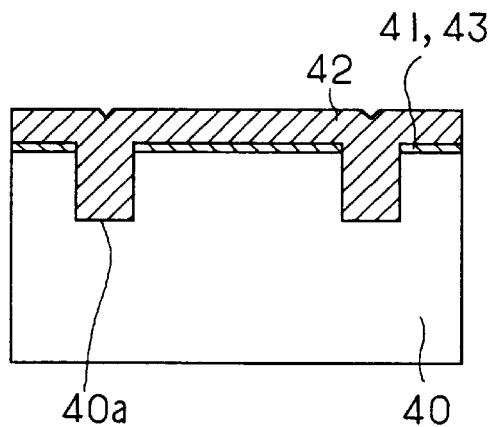
FIGS. 18A through 18C and FIGS. 19A through 19C are respectively sectional views each illustrating local process steps in a dielectric isolation technique for performing dielectric isolation of a semiconductor substrate.
Figure 19A:
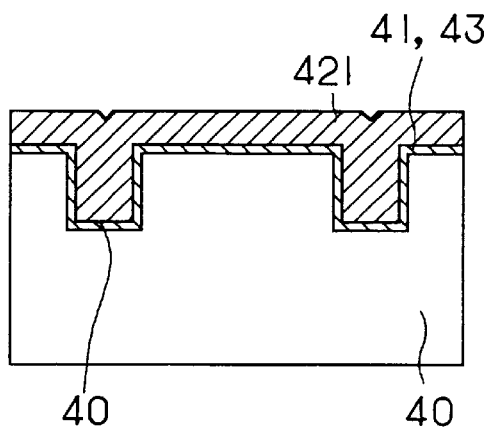
Figure 18B:
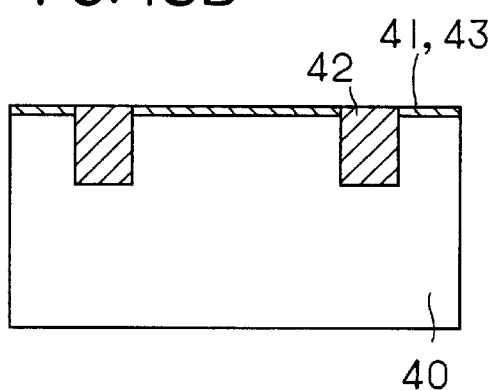
Figure 19B:
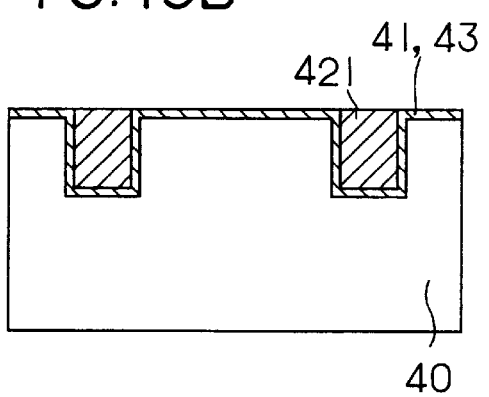
Figure 18C:
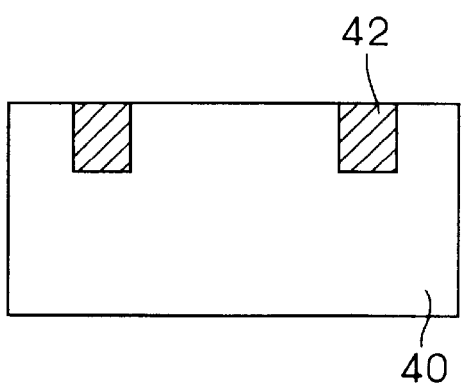
Figure 19C:
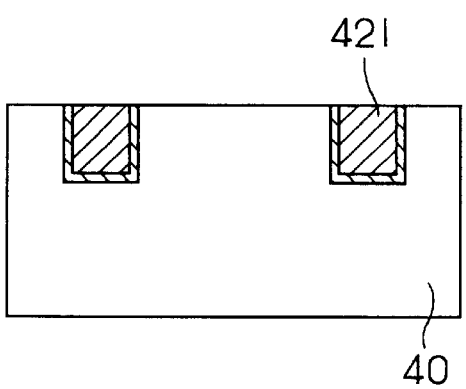
Figure 20A:
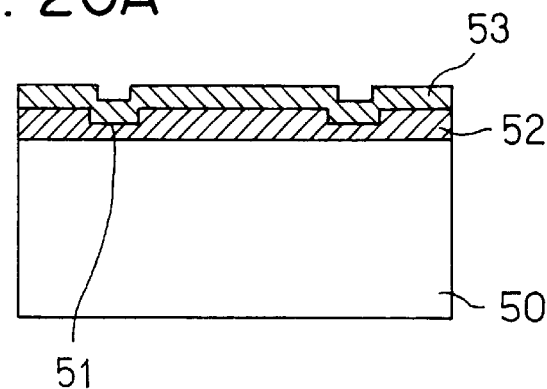
FIGS. 20A and 20B are sectional views of a semiconductor substrate illustrating local process steps in a wiring technique therefor.
Figure 20B:
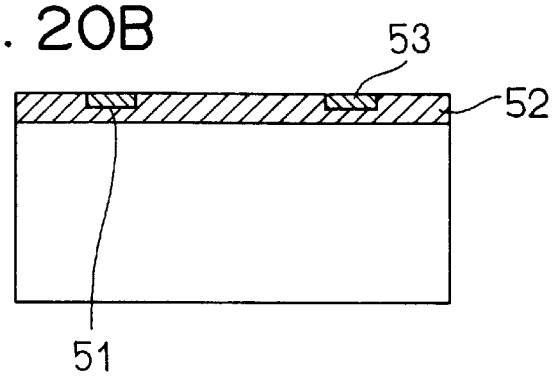

Also, even when a selective polishing technique used in the dielectric isolation technique for device isolation of a semiconductor substrate illustrated in FIGS. 18A to 18C and FIGS. 19A to 19C and a selective polishing technique used in the wiring technique illustrated in FIGS. 20A and 20B are performed on the same principle as in the case of the above-mentioned selective polishing of SOI substrate, that is, a material to be polished (metal, insulator film, silicon film) or the like is polished by using as a stopper a material (metal, insulator film, or the like) whose polishing rate is lower than that of the material to be polished, it is possible to detect an end point of polishing by the variation in temperature of the polishing pad in the same manner as in the case of the above-mentioned selective polishing of an SOI substrate.

Figure 21A:
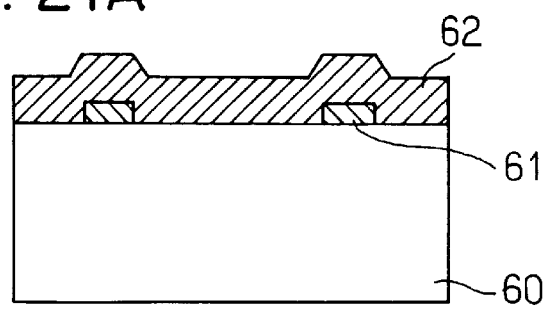
FIGS. 21A and 21B are sectional views of a semiconductor substrate illustrating local process steps in a multi-layer wiring technique therefor.
Figure 21B:
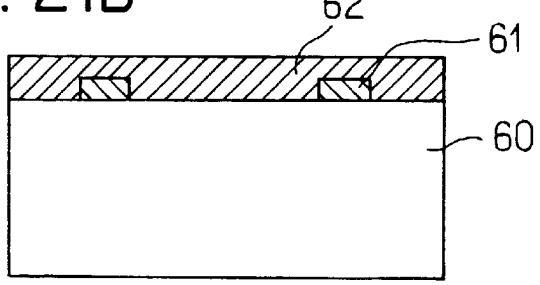

Also, even when in the multi-layer wiring technique for a semiconductor substrate illustrated in FIGS. 21A and 21B the irregularities of an interlayer dielectric film are planarized by a polishing process, it is possible to perform an end point detection of polishing by the variation in temperature of the polishing pad during the polishing process.

In this case, although no stopper exists, in a case where irregularities, or recessed and protruding portions, exist on a surface to be polished, in the polishing process the protruding portions are selectively polished. This is because the protrusions more strongly contact the polishing pad than the recessed portions. In an initial stage of polishing during execution of the multi-layer wiring technique, the surface of an interlayer dielectric film is in a state having recessed and protruding portions and therefore the protruding portions more strongly contact the polishing pad and the recessed portions are less likely to contact it. When compared to a plane surface to be polished which has no irregularities (this state corresponding to an end point of polishing), the surface of the insulator film constituting a surface to be polished reacting with the polishing pad via a polishing slurry is small in area and less reaction heat is also generated in an initial stage of polishing. However, due to variations in degree of level of the recessed and protruding portions occurring when the polishing process proceeds, the reaction area also varies with the result that the amount of reaction heat generated varies. Also, the amount of heat generated due to friction between the surface to be polished and the polishing pad also varies according to the degree to which the recessed and protruding portions are levelled as the polishing process proceeds. Namely, since the degree of level of the recessed and protruding portions becomes less as the polishing process proceeds, the reaction area between the surface to be polished and the polishing pad increases with the result that the reaction heat and also the friction heat vary.

As mentioned above, since the amount of heat generated varies as the duration at which the polishing process proceeds, the temperature of the polishing pad also varies. When the recessed and protruding portions are levelled, with the result that the surface to be polished uniformly contacts the polishing pad, the amount of heat generated becomes fixed, with the result that the temperature of the polishing pad is saturated.

The present invention has been achieved on the basis of the above-mentioned various experiments and considerations performed and completed by the present inventors.

More specifically, the present invention is characterized in that, in a polishing process using a polishing pad, the temperature of a portion of the polishing pad having polished a surface is measured at a position immediately after the performance of this polishing operation and end point detection of a polishing process is performed on the basis of variations in the temperature thus measured.

Accordingly, it is possible to detect an end point of a polishing process without performing an operation of, for example, confirming a polished state of the substrate during the polishing process by detaching this substrate.

In this case, since the temperature of a portion of polishing pad after polishing a surface at a position immediately after the performance of this polishing operation is measured, it is possible to detect the end point of the polishing process with high precision without the effect of variations in temperature of different portions of the polishing pad.

Also, the present invention is characterized in that an end point of a polishing process is detected utilizing the relationship between a total amount of heat calculated from the temperature of a polishing pad and the time duration of polishing, that is, the total amount of heat generated by polishing as measured from a time when polishing has been started, and the volume of a portion of a material to be polished which has been removed by selective polishing.

By utilizing the correspondence relationship between the total amount of heat as measured from the time when polishing is started and the volume of a material to be polished, it is possible to detect an end point of the polishing process with high precision irrespective of the conditions under which polishing is performed.

Also, the present invention is characterized in that adjustment of temperature is performed so that the temperature of the turntable on which the polishing pad is mounted becomes fixed.

When adjustment of the temperature of the turn table is not performed, it becomes less likely that the temperature (or amount of heat generated) of the polishing pad during a polishing process will become saturated. However, by adjusting of the temperature of the turntable, the temperature (or amount of heat generated) thereof can be saturated, whereby it is possible to detect the end point of the polishing process with precision.

Further, the present invention is characterized in that a polishing process is performed while the polishing position is being swung in the radial direction of the pad.

When the polishing position is fixed, the temperature of the polishing pad continues to rise as the polishing process proceeds, with the result that the polishing precision decreases due to, for example, variation in the polishing rate. However, by swinging the polishing position, it is possible to improve polishing precision. Even in a polishing process wherein the polishing position is swung, by measuring the temperature of a portion of the polishing pad having polished at a position immediately after the performance of this polishing operation, it is possible to detect the end point of the polishing process with precision. In this case, if the temperature detecting means is also moved simultaneously with the movement of the polishing position in the same manner, the position of a temperature measuring point can be set at all times to a position immediately after a portion of the polishing pad where polishing has been performed.

Also, in such a polishing process wherein the polishing position is swung, if adjustment of the temperature of the turntable is made, it is possible to detect the end point of the polishing process with higher precision because the reference polishing pad temperature becomes fixed even if the temperature measuring position varies.

The present invention will now be explained on the basis of the embodiment illustrated in the relevant figures.

FIGS. 1A to 1G illustrate process steps for manufacturing an SOI substrate in this embodiment mode.

First, as illustrated in FIG. 1A, at least one surface of a first semiconductor substrate 1 consisting of a single crystal silicon is polished to a mirror surface 1a. Part of this mirror surface 1a is selectively etched by wet chemical etching or dry etching such as reactive ion etching (RIE) to thereby form a recessed portion 2. The depth of the recessed portion 2 is from, for example, 0.01 to 1 $\mu$m and this recessed portion 2 is formed as a scribing area or dielectric isolation region.

Next, a silicon dioxide film (insulator film) 3 having a thickness of, for example, 0.1 $\mu$m to 5 $\mu$m is formed by thermal oxidation, CVD or the like. Note that the insulator film 3 need not be a silicon dioxide film but may be a silicon nitride film formed with the use of a CVD method or the like.

Next, as illustrated in FIG. 1B, a polycrystalline silicon 4 is deposited, for example, to 3 $\mu$m or more with the use of an LPCVD method or the like. Next, as illustrated in FIG. 1C, the polycrystalline silicon 4 is polished and planarized to thereby remove depressions and protrusions therefrom and form a mirror surface 4a.

Next, as illustrated in FIG. 1D, a mirror surface 5a of a second semiconductor substrate 5, consisting of a single crystal silicon and which has at least one surface polished to a mirror surface, and the mirror surface 4a of the above-mentioned polycrystalline silicon are bonded to each other by using a known wafer bonding technique.

Next, as illustrated in FIG. 1E, the first semiconductor substrate 1 is ground at a surface 1b side thereof and then, as illustrated in FIG. 1F, is polished. The polishing performed at this point in time may be one which is ordinarily performed because it is for the purpose of eliminating surface depressions and protrusions and the crushed layer by grinding.

In this polishing process step of FIG. 1F, 2 to 5 $\mu$m of the silicon 1 is eliminated by ordinary polishing. In this polishing process, in order to lessen the amount of silicon eliminated by selective polishing to the largest possible extent, polishing is performed up to a point in time immediately before the silicon dioxide film 3 as a stopper is exposed, for example, so that the thickness of the silicon on the silicon dioxide film 3 which is to be a stopper becomes 1 $\mu$m or less. Also, it is preferable that polishing variation within the substrate be minimized.

The reason for this is as follows. Namely, when selective polishing is performed, the polishing rate for silicon is made lower than that when ordinary polishing is performed, and therefore it is intended to shorten the time period in which selective polishing is performed. Also, while a point in time when the silicon dioxide film 3 as a stopper has been exposed on the surface of the substrate is the end point of polishing, it serves to increase the precision of end point detection and also decrease the variation in silicon thickness if all portions of the silicon dioxide film 3 are exposed as simultaneously as possible.

Next, as illustrated in FIG. 1G, the silicon dioxide film 3 formed in the recessed portion 2 is exposed on the 1b side surface of the substrate to thereby form an SOI layer 6. At this time, the polishing process is performed by selective polishing wherein the silicon dioxide film 3 is made to function as a stopper.

Thereafter, although not illustrated, a MOSFET (semiconductor device) is formed in the SOI layer 6 of the semiconductor substrate manufactured through the performance of the above-mentioned process steps by use of a general MOSFET manufacturing technique.

This embodiment is characterized in that in the above-mentioned selective polishing, an end point of detection of the polishing process is performed by monitoring variations in the temperature of the polishing pad used therein.

Figure 7:
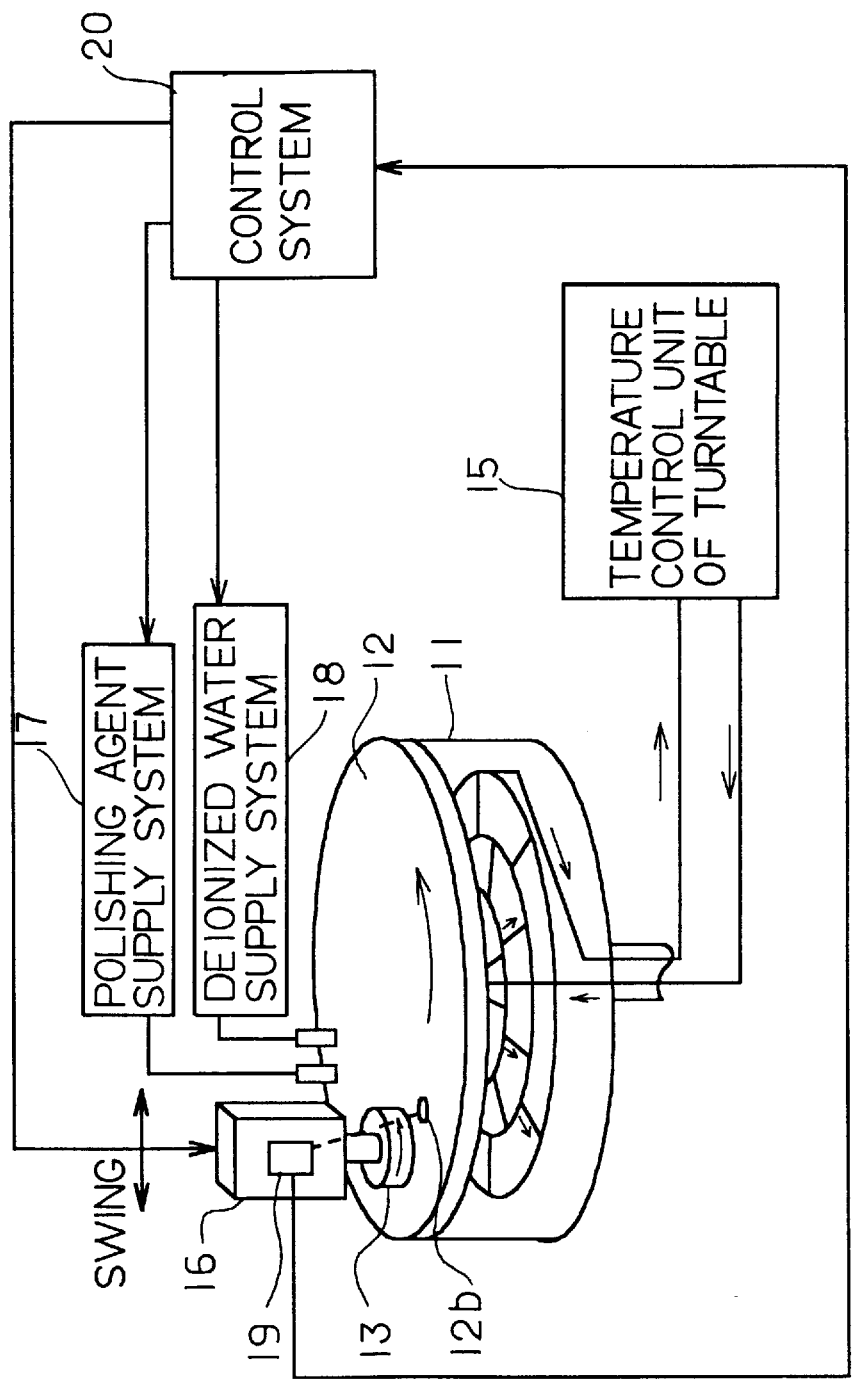
FIG. 7 is a view illustrating a concrete construction of the polishing device.
Figure 8:
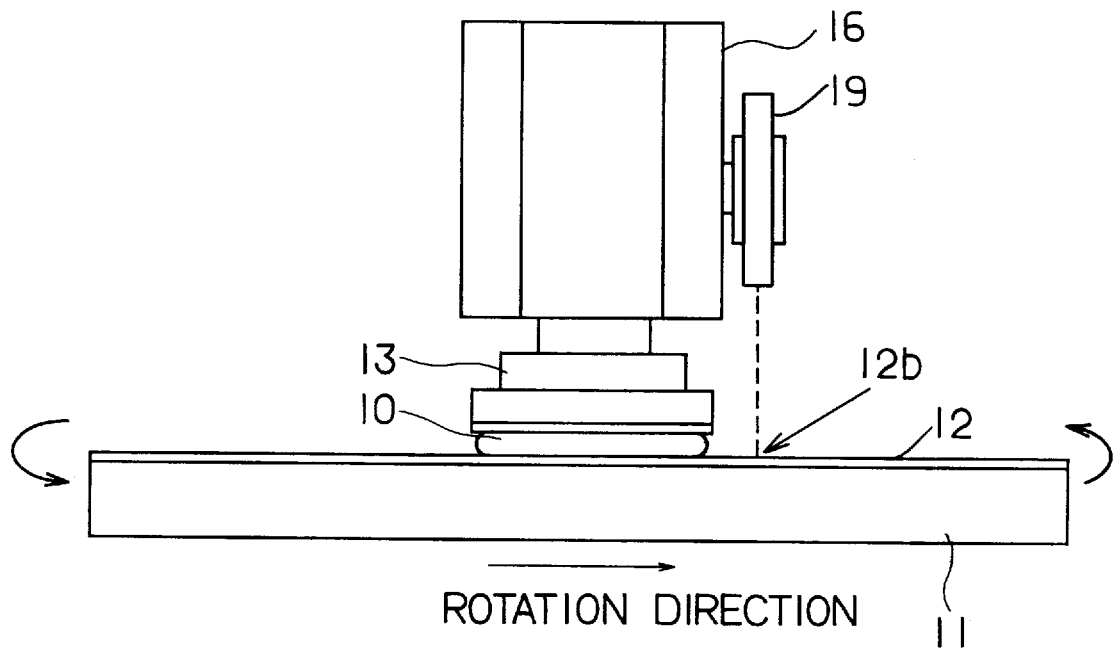
FIG. 8 is a view illustrating a portion of the polishing device illustrated in FIG. 7 where a polishing process is performed, taken from the side thereof.

A detailed construction of the polishing device is illustrated in FIG. 7. Also, a portion where polishing is performed as viewed from a side thereof is illustrated in FIG. 8.

In FIG. 7, the turntable 11 has the polishing pad 12 mounted on its surface and is rotated at a prescribed speed. This turntable 11 is adjusted to a prescribed temperature (for example, 20° C.) by a temperature control unit 15. Namely, water (temperature-controlled water) is circulated as illustrated from the temperature control unit 15 through a groove (passage) provided in the turntable 11, whereby the temperature of the turntable 1 is maintained.

Also, the chuck table 13 for retaining the wafer 10 has a retention surface which opposes the turntable 11 and on which the wafer 10 is fixed, and is rotated at a prescribed speed. A drive unit 16 rotatably retains the chuck table 13, presses the wafer 10 fixed on the retention surface of the chuck table 13 against the turntable 11, and swings the chuck table 13 in the radial direction (radial direction of the turntable 11) of the polishing pad 12 as indicated by the arrow mark in the figure. Also, a polishing slurry and deionized water are dropped onto the polishing pad 12 by a polishing slurry supply system 17 and a deionized water supply system 18.

Also, a temperature sensor 19 serving as temperature detecting means is mounted on the drive unit 16 and detects in non-contact manner the temperature of a temperature measuring point 12b, that is, the temperature of portion of the polishing pad 12 (the portion thereof at a position immediately after polishing on a downstream side of rotation from a portion of the polishing pad against which the wafer 10 has been pressed) at a position immediately after contact thereof with the wafer 10 during the selective polishing process. As mentioned above, the temperature sensor 19 is fixed to the drive unit 16 and is swung jointly with the swinging motion thereof. Preferably, the temperature sensor 19 is fixed to the drive unit 16 on the downstream side of rotation of the turn table 11. Also, more preferably, the temperature sensor 19 is fixed so that the temperature of the polishing pad within a swing range of the chuck table 13 is detected. Preferably, the temperature measuring point 12b is set to a position of the polishing pad 12 immediately after polishing, that is, a substantially central position of the swing range of the chuck table 13 on the downstream side of rotation from a portion of the polishing pad 12 where the wafer 10 has been pressed.

A control system 20 rotates the turntable by a drive means, not illustrated, during the polishing process, and controls the driving operation of the drive unit 16 to thereby rotate the chuck table 13 jointly with the wafer 10, and simultaneously swings this chuck table 13 in the radial direction of the polishing pad 12. It also adjusts pressurization of the wafer 10, and causes supply of the polishing slurry and deionized water and the lift motion of the chuck table 13.

This control system 20 controls the end of the polishing process on the basis of the temperature detected by the temperature sensor 19.

Figure 9:
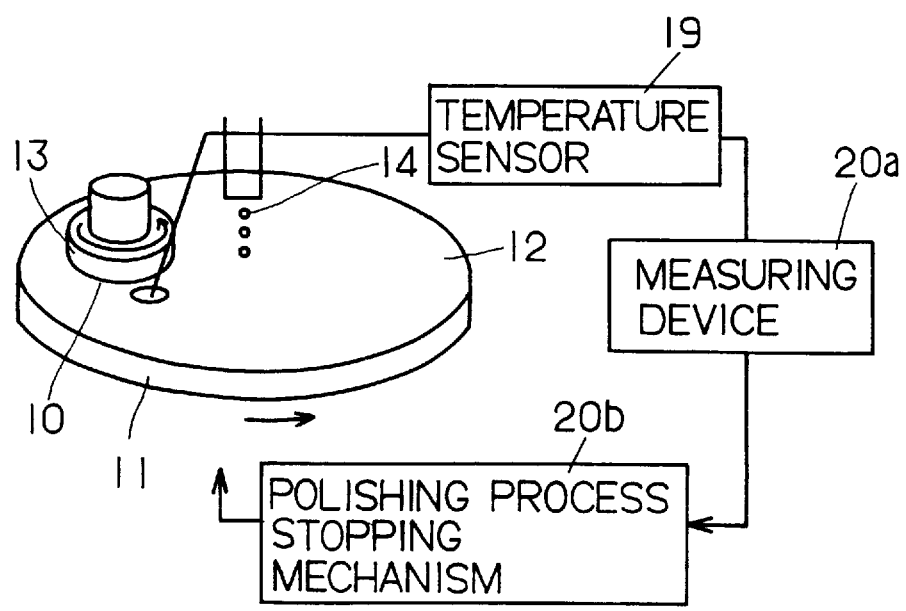
FIG. 9 is a view illustrating a construction for controlling termination of a polishing process.

FIG. 9 illustrates a schematic construction of a portion where control of the end of polishing process is performed.

A temperature signal obtained by detection made by the temperature sensor 19 is input to a measuring device 20a using a microcomputer or the like. The measuring device 20a performs a control for selective polishing on the basis of the input temperature signal. Examples of the control for selective polishing will be explained hereafter.

Figure 10:
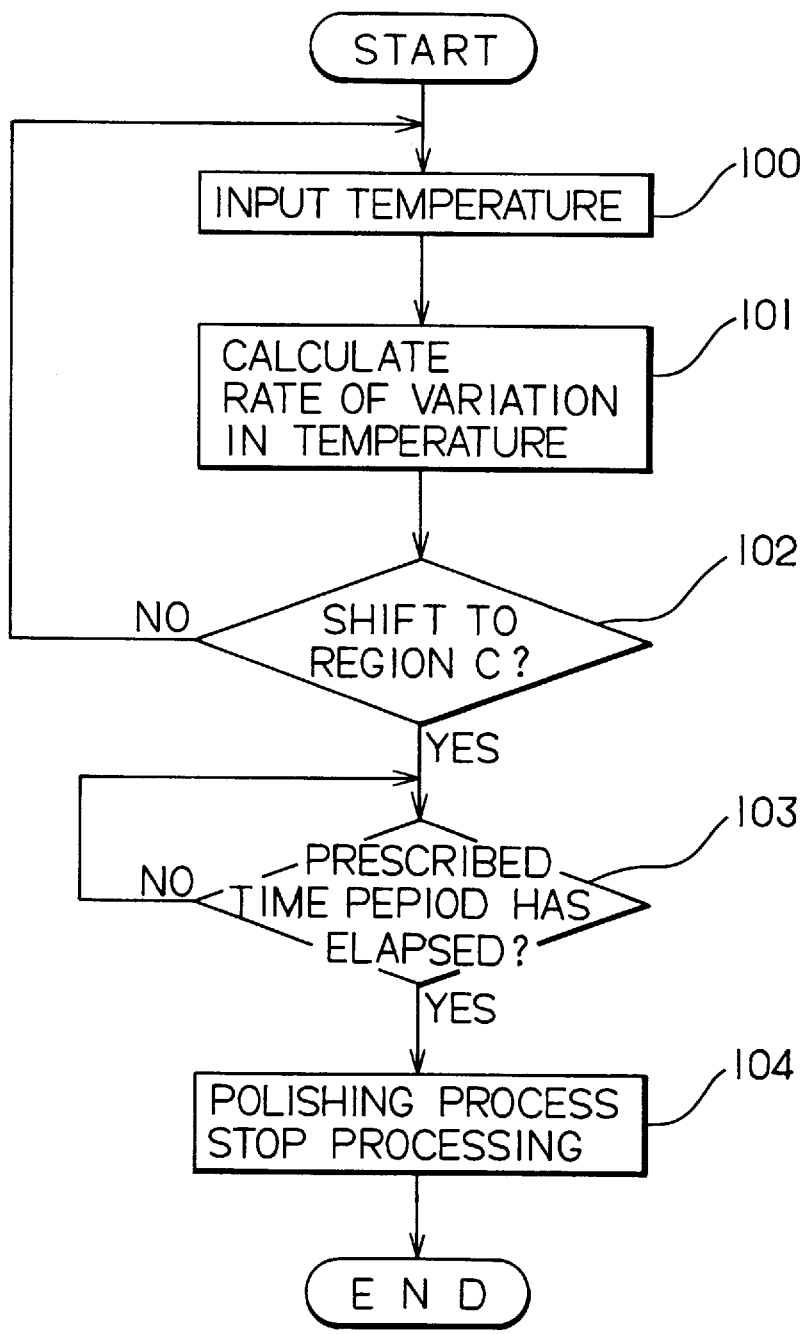
FIG. 10 is a flow chart illustrating a first control example for controlling selective polishing.

A first example of control for selective polishing is illustrated in FIG. 10.

First, a temperature signal from the temperature sensor 19 is input at prescribed time intervals (step 100), the rate of variation in the temperature being calculated on the basis of this temperature signal (step 101). On the basis of this rate of variation in temperature, whether or not the temperature has shifted from a state of the region A illustrated in FIG. 3 to a state of the region B and further to a state of the region C is determined (step 102). Namely, it is determined whether or not the rate of variation in temperature has shifted from a positive state to a negative state (region A–region B) and then to a saturated state where the rate of variation in temperature is below a prescribed value of around 0.

When it has been determined from the temperature that the polishing state has shifted to the region C, the operation is placed in standby for a prescribed period of time (for several minutes) (step 103). When a prescribed period of time has lapsed, a polishing-process stopping process is performed (step 104) as the end point of the selective polishing.

This polishing-process stopping process is performed by, when the polishing process is performed on a single wafer processing basis, causing deionized water to flow in place of the polishing slurry 14 and performing a rinsing process or by lifting the chuck table 13 and separating the wafer 10 from the polishing pad 12. Also, in the case of a device having a plurality of chuck tables, a measuring device is provided with respect to each table, whereby the table is lifted for each table to thereby separate the wafer from the polishing pad 12 and stop the polishing process.

In this case, the above-mentioned polishing-process stopping process can be performed automatically by means of a polishing-process stopping device 20b of FIG. 9 or manually by notification of an end point of selective polishing by means of a buzzer or the like from the measuring device 20a when it has been determined that selective polishing has been completed. Note that the measuring device 20a and the polishing-process stopping device 20b constitutes part of the control system 20.

Through the performance of the above-mentioned end point detection of selective polishing, it is possible to form an SOI layer having a uniform thickness in a necessary minimum polishing time period while practicing only, and by means of a single process.

Also, since the manner in which the wafer is polished varies depending upon the type, temperature and the like of the polishing slurry 14 and polishing pad 12, the polishing conditions such as the speed of rotations of the turntable 11, the pressure for pressing the substrate and the like, and further the pattern of the silicon dioxide film on the substrate becoming a stopper, and the area ratio between the silicon dioxide film and the silicon, etc., it is preferable that the method of determining a saturation point of temperature be set according to the applied conditions.

Also, preferably, an end point of selective polishing is determined, for example, such that polishing is ended simultaneously with a time when the temperature becomes fixed or that polishing is ended when the temperature becomes fixed and a prescribed period of time (e.g., 5 minutes) has lapsed thereafter, so that for each condition as applied an optimum polished state is reached.

Although in the above-mentioned first example of control the end of polishing was determined by the temperature of the polishing pad or the rate of variation in temperature having become a prescribed value, it may be determined by determining that the rate of variation in the temperature has become a minimum value, that is, the two times differentiated value of the temperature has become 0. Next, this determining method will be explained as a second example of control.

Figure 11A:
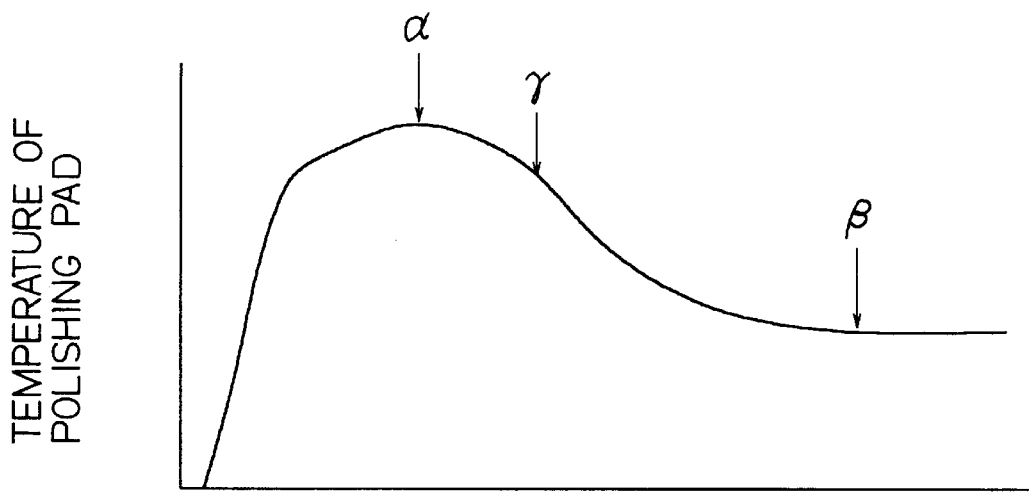
FIG. 11A is a graph showing variations in temperature of a polishing pad relative to a polishing time duration when selective polishing is performed.
Figure 11B:
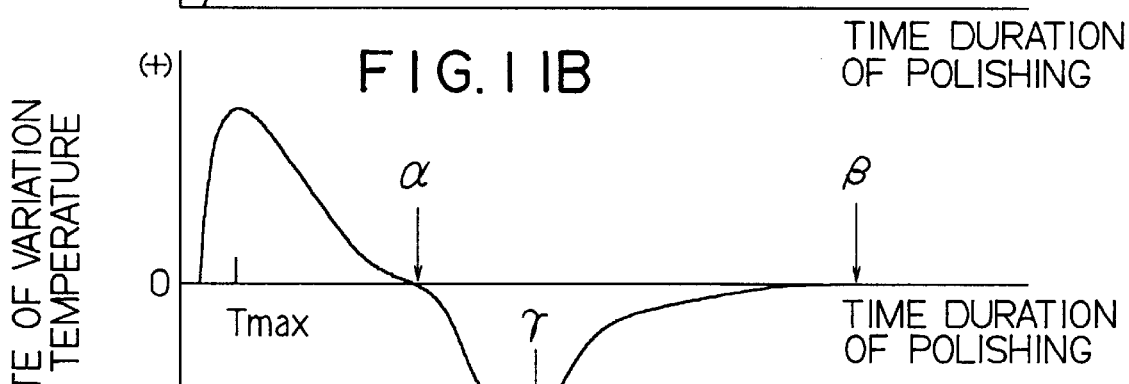
FIG. 11B is a graph showing a rate of variation in this temperature.
Figure 11C:
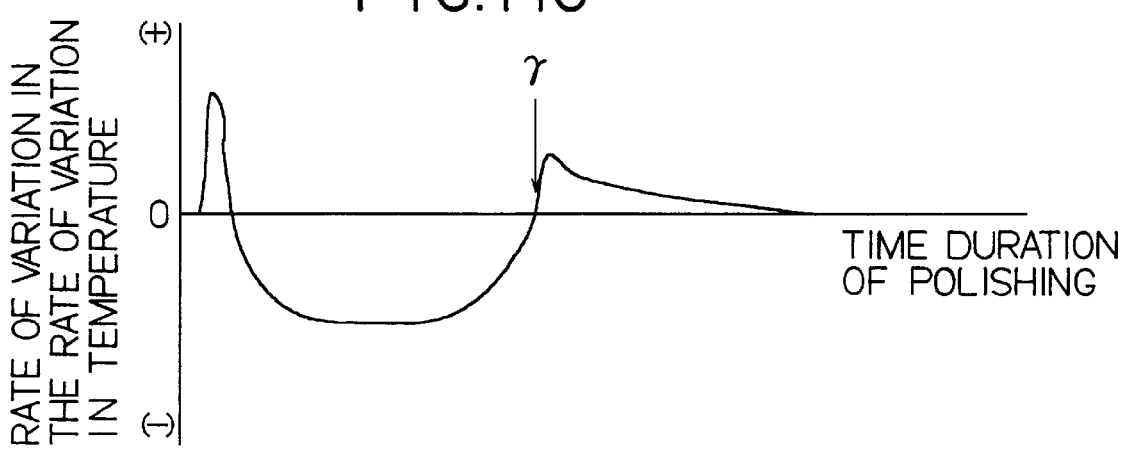
FIG. 11C is a graph showing a rate of change in this rate of variation.

FIG. 11A illustrates variations in the temperature of the polishing pad relative to the selective polishing time period, FIG. 11B illustrates a rate of variation in the temperature, and FIG. 11C illustrates a rate of variation in this rate of variations in the temperature. When the silicon dioxide film 3 as a stopper is locally exposed on the surface with the result that the area of silicon on the stopper decreases, the rate of variation in the temperature becomes negative (point in time indicated by $\alpha$ in FIGS. 11A and 11B). The rate of variation in the temperature after the point $\alpha$ in time has a minimum value and, before long, becomes 0 (at which the temperature of the polishing pad is fixed, a point in time indicated by $\beta$). At the point $\beta$ in time, the heat generated due to excess polishing (variation of polishing) is also saturated. This means that between the points $\alpha$ and $\beta$ in time there exists a border point between the heat generated due to polishing of silicon on the stopper and the heat generated due to excess polishing (polishing variation). In this second example of control, end of polishing is determined on the basis of the minimum value (point $\gamma$ in time) of the rate of variation in the temperature.

Figure 12:
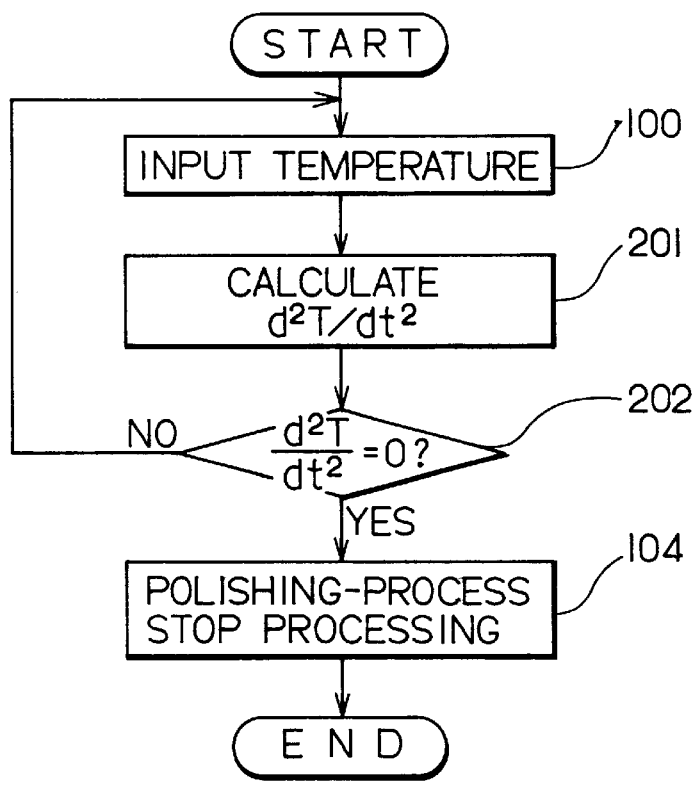
FIG. 12 is a flow chart illustrating a second control example for controlling selective polishing.

FIG. 12 illustrates a detailed process performed in the second example of control. The same reference numerals as those illustrated in FIG. 10 represent the same processing.

A temperature signal from the temperature sensor 19 is input in units of a prescribed time period $\Delta t$, the two times differentiated value $(d^2T/dt^2)$ of a time t relative to the temperature T of the polishing pad 12 is calculated (step 201), and it is determined whether or not this value $d^2T/dt^2$ has become 0 (step 202). When the rate of variation in the temperature becomes minimum with the result that the value $d^2T/dt^2$ becomes 0, polishing is ended.

Also, preferably, the timing with which the temperature signal from the temperature sensor 19 is input is made to become a multiple of the cyclic period for swinging the substrate. This is because the temperature of the polishing pad immediately after contact thereof with the substrate varies (the shorter the distance from the center of the polishing pad is, the higher the temperature relatively becomes) according to the position of the substrate with respect to the polishing pad (the distance thereof from the center of the polishing pad).

Also, polishing may be ended in a prescribed time period after the minimum value has been determined in step 202. This is because when the variations in thickness of the silicon on the stopper prior to performance of the selective polishing are large, the time period in which polishing of the silicon on the stopper and excess polishing (polishing variation) are simultaneously performed within the substrate becomes long with the result that the minimum value sometimes does not become the border point.

Next, a third example of control will be explained.

In the above-mentioned examples of control, there are cases where according to the conditions for selective polishing it is difficult to accurately end the polishing processes for all wafers, including for example, a case where the variations in thickness of the silicon on the stopper prior to selective polishing are large, a case where all portions of the stopper are not exposed simultaneously over an entire surface of the wafer during selective polishing, a case where the area of the SOI layer is so large that dishing of the area of the SOI layer readily occurs, or a case where selective polishing is performed under the polishing conditions wherein polishing variations are likely to occur (not adjusting the pH value of the polishing slurry by use of hydrogen peroxide, using a soft polishing pad, etc.). In the above-mentioned cases, sometimes the temperature of the polishing pad and the rate of variation in the temperature thereof vary between the wafers. Accordingly, in the case of a selective polishing from which a higher precision of end point detection is demanded, there are cases where controls in the above-mentioned examples of control are insufficient.

As a countermeasure against this, in this third example of control, end point of polishing is detected using the relationship between a total amount of heat generated from a time of start of polishing and a volume of the substrate removed by selective polishing.

First, the theory behind the third example of control will be explained.

A total amount Q of heat generated when silicon is removed by selective polishing can be determined from an amount of silicon removed, that is, the volume V of the removed silicon portion. It can be determined from the following equation (1) by, for example, multiplying the volume V by a prescribed constant c1.

$$Q = c1 \times V \tag{1}$$

where the constant c1 is set according to the conditions for selective polishing (polishing slurry used, polishing pad used, etc.).

Figure 13:
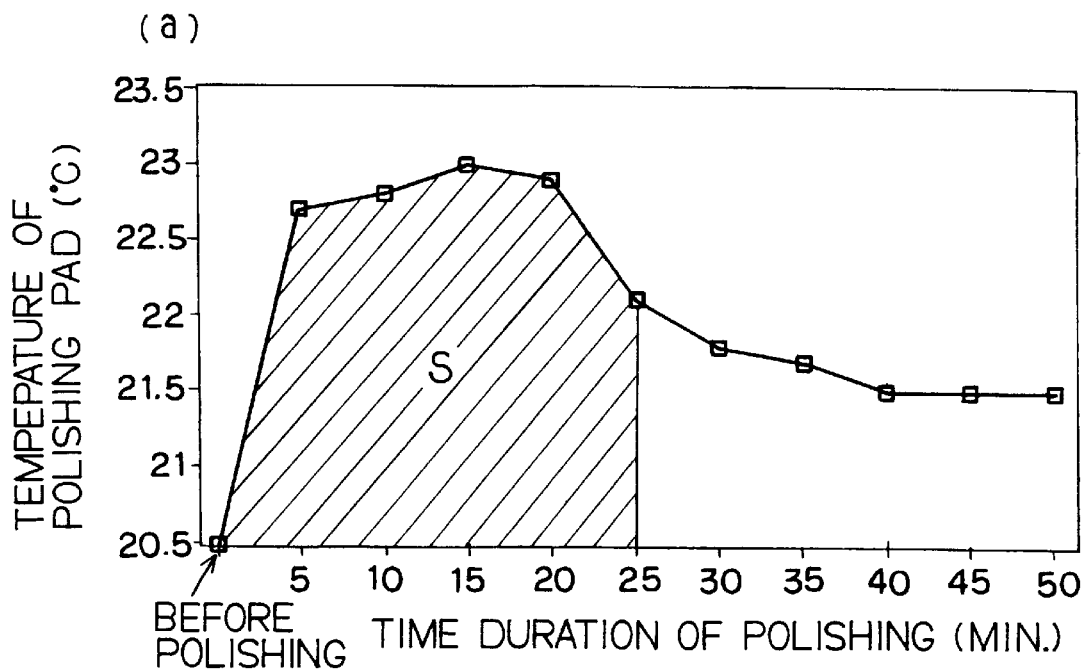
FIG. 13 is a graph illustrating the total amount of heat generated from start of polishing as calculated from the temperature of a polishing pad and polishing time duration.

On the other hand, in a selective polishing, the total amount Q of heat generated actually is in proportion to the area S of a region hatched in a graph of FIG. 13 (corresponding to the graph of FIG. 3). Accordingly, assuming that a constant c2 represents the proportionality factor, the amount Q of heat generated actually is expressed by the following equation (2).

$$Q = c2 \times S \tag{2}$$

The following equation (3) is obtained from the above equations (1) and (2).

$$S = (c1/c2) \times V \quad (3)$$

Accordingly, if the amount V of silicon removed is previously determined and when the area S determined from the polishing period of time and the temperature of the polishing pad has satisfied the equation (3) it is determined that polishing has been ended, it is possible to detect the end of polishing with a high accuracy.

While the value of (c1/c2) in the equation (3) is a constant, this value is determined according to the conditions for selective polishing, etc. Accordingly, by, for example, actually bare silicon wafers under the same conditions for selective polishing for a prescribed period of time, the value (c1/c2) is calculated from the amount V of silicon wafer removed and the area S obtained from a graph of the variation in temperature of the polishing pad relative to the time duration of polishing performed thereby and is thereby set beforehand.

Figure 14:
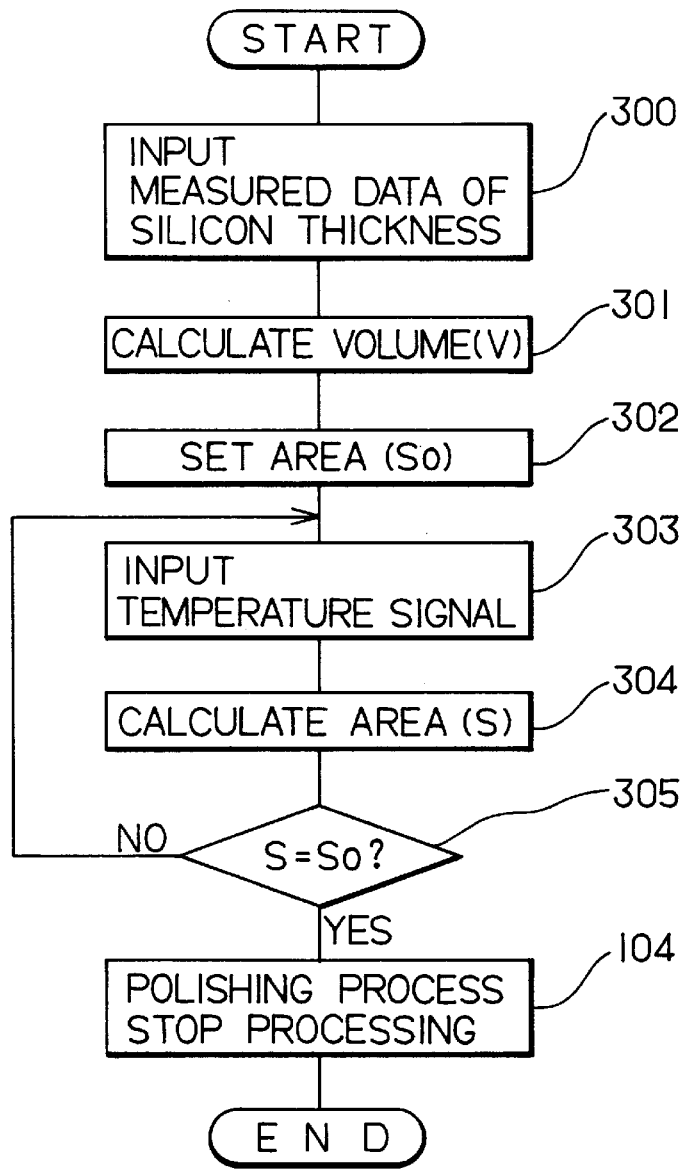
FIG. 14 is a flow chart illustrating a third control example for controlling selective polishing.

A detailed process in the third example of control based on the above-mentioned theory is illustrated in FIG. 14.

Figure 15:
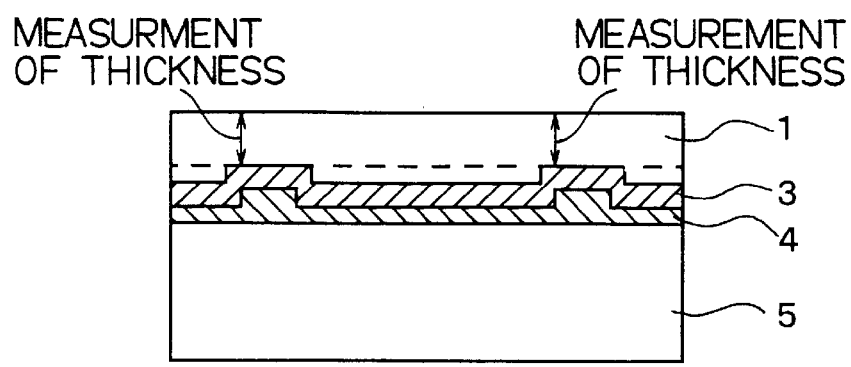
FIG. 15 is a sectional view illustrating a state of measuring the thickness of silicon on a silicon dioxide film 3 over an entire surface of the substrate in order to execute the third control example.
Figure 17A:
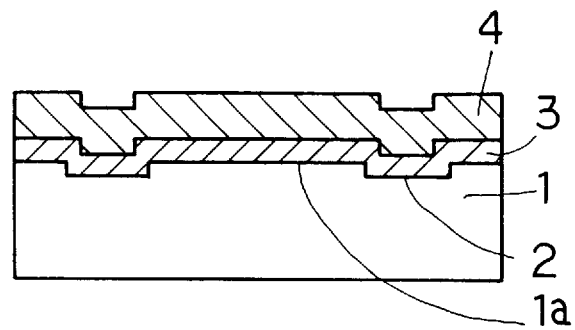
FIGS. 17A through 17C are sectional views illustrating an SOI substrate in the manufacturing process steps therefor when forming a conventional SOI layer.
Figure 17B:
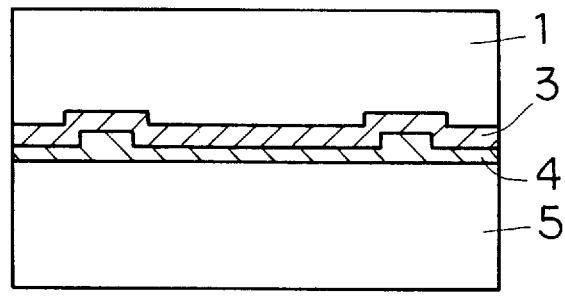
Figure 17C:
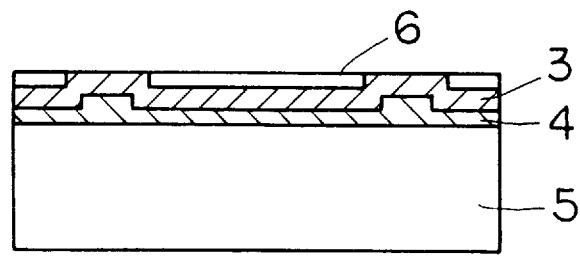

First, prior to selective polishing, as illustrated in FIG. 15, the thickness of the silicon on the silicon dioxide film 3 becoming a stopper is measured over an entire surface of the substrate. This measurement is performed by non-contact measurement which uses an optical method. Note that it serves to increase the precision of end point detection by measuring as many points as possible.

The measuring device 20a (FIG. 9) inputs data of the measured thickness from an input device not illustrated (step 300).

Next, the volume V of the silicon to be removed by selective polishing is calculated from the data of the measured thickness (step 301). Further, the area So (quantity of heat) for ending the selective polishing is set from this volume V by use of the equation (3) (step 302).

Thereafter, a temperature signal from the temperature sensor 19 is input (step 303) and, from an integrated value thereof, the area S illustrated in FIG. 13 is determined (step 304). Then, it is determined whether or not the area S has become equal to the area So as set (step 305). Then, when the area S has become equal to the area So, an end of polishing is determined.

By using the correspondence relationship between the total amount of heat as measured from the start of polishing and the volume of the polishing material as mentioned above, it is possible to detect an end point of polishing with a high precision regardless of the polishing conditions.

In the first to third examples of control, detection of the temperature is not limited to one wherein the temperature of a portion 12b of the polishing pad having polished at a position immediately thereafter is detected. As illustrated in FIG. 16, the temperature of a portion 12b of the polishing pad having polished the substrate at a position immediately thereafter and that of a portion 12c of the polishing pad having polished the substrate at a position immediately prior thereto may be measured simultaneously, whereby the difference between the both temperatures may be used. As a result of this, even when the temperature of a portion 12b of the polishing pad having polished the substrate varies due to swing thereof during the polishing process, it is possible to detect an end of polishing with a high precision.

The above-mentioned polishing and the detection of an end point thereof performed and made using the polishing pad 12 can be applied quite similarly to the polishing process performed by the techniques illustrated in FIGS. 18A to 18C, FIGS. 19A to 19C, FIGS. 20A and 20B and FIGS. 21A and 21B.

Also, even when as mentioned above the position of the wafer 10 on the polishing pad 12 is moved relatively thereto, by simultaneously moving the temperature sensor 19 as well, it is possible to set the position of the temperature measuring point 12b at all times at a position immediately after a polishing portion. Accordingly, it is possible to detect the temperature of the polishing pad 12 with a high precision.

In the embodiment illustrated in FIGS. 18A to 18C, selective polishing is performed by forming the insulator film 41 (silicon dioxide film or nitride film) or metal film 43 over an entire surface of the semiconductor substrate 40, forming the trenches 40a, thereafter depositing the insulator film 42 over the surface of the resulting structure, and thereafter performing selective polishing by using as a stopper the insulator film 41 or metal film 43 formed in the regions of the semiconductor substrate 40 having no trenches formed therein. Also, when the polycrystalline silicon 421 is deposited on the insulator film 41 (silicon dioxide film or nitride film), it is preferable that the insulator film is further formed in the trenches 40a as illustrated in FIGS. 19A to 19C.

Also, although in the above-mentioned embodiments, the saturated state of an amount of heat generated during the polishing process was detected by measuring the temperature of the polishing pad 12, an end point of polishing may be also detected similarly by measuring an amount of heat generated in other portions than the polishing pad.

Also, although it is preferable that measurement of the temperature of the polishing pad 12 be non-contact measurement such as measurement made using radiation energy, the measurement thereof may be contact measurement such as that made using a thermocouple.

Also, although in the above-mentioned embodiments the chuck table 13 is swung by the drive unit 16 in the radial direction of the polishing pad 12 as rotated, this swing may be performed in a direction different from the rotation direction of the turntable 11 (polishing pad 12). For example, the swing motion may be performed in parallel or slantwise with respect to the radial direction of the turntable 11 as rotated.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method for polishing a material, said method comprising the steps of:

providing a stopper material having at least one protruding portion extending through a portion of the material and towards a surface of the material, the stopper material being selected to have a polishing rate lower than a polishing rate of the material;

polishing the surface of the material with a polishing pad constructed and arranged to make contact with the surface of the material;

measuring a temperature of the polishing pad at different times during said polishing step to obtain a plurality of measured temperatures; and detecting an end point of said polishing step based on variations of the measured temperatures.

2. A method according to claim 1, wherein the material is a semiconductor substrate consisting of silicon and the stopper material is an insulator film.

3. A method according to claim 2, wherein the insulator film is an oxidized film or a nitride film.

4. A method according to claim 1, wherein the material is an insulator film deposited on a semiconductor substrate having a trench formed therein for isolating devices, and the stopper material is a nitride film or metal film formed on regions of the semiconductor substrate having no trench formed therein.

5. A method according to claim 1, wherein the material is a polycrystalline silicon deposited on a semiconductor substrate having a trench formed therein for isolating devices, and the stopper material is an insulator film formed on regions of the semiconductor substrate having no trench formed therein.

6. A method according to claim 1, wherein the material is a metal film for wiring, wherein said stopper material is an insulator film having a recessed portion formed therein, and wherein the metal film is deposited on the insulation film, which is deposited on a semiconductor substrate.

7. A method according to claim 1, wherein the end point of said polishing step is detected when the temperature of the polishing pad has shifted from a prescribed state of variation to a saturated state.

8. A method according to claim 1, wherein the end point of said polishing step is detected when a rate of variation of the temperature of the polishing pad relative to a time duration has shifted from a negative state to about 0.

9. A method according to claim 1, wherein the end point of said polishing step is detected after a prescribed period of time has elapsed since a rate of variation of the temperature of the polishing pad relative to a time duration has shifted from a negative state to about 0.

10. A method according to claim 1, wherein the end point of said polishing step corresponds to a time when a rate of variation of the temperature of the polishing pad relative to a time duration has shifted to a minimum value of the rate of variation.

11. A method according to claim 1, wherein:
said measuring step comprises measuring a first temperature of the polishing pad at a position where a portion of the polishing pad passes immediately before the portion of the polishing pad polishes the surface of the material and measuring a second temperature of the polishing pad at a position where the portion of the polishing pad passes immediately after the portion of the polishing pad polishes the surface of the material; and
said detecting step comprises detecting the end point of said polishing step based on the difference between the first and second temperatures.

12. A method according to claim 1, wherein the polishing step comprises mounting the polishing pad on a turntable and adjusting a temperature of the turntable so as to become fixed.

13. A method according to claim 1, wherein the polishing step comprises rotating the polishing pad and swinging the material relative to polishing pad along a radial direction of the polishing pad.

14. A method for polishing a semiconductor substrate to a prescribed thickness with a polishing pad, said method comprising the steps of:
rotating a turntable having the polishing pad disposed on a surface thereof at a prescribed speed;
polishing a surface of the semiconductor substrate, said polishing step comprising rotating a chuck table with the semiconductor substrate fixed thereto at a prescribed speed, swinging the chuck table relative to the turntable so as to follow a swinging motion, and pressing the surface of the semiconductor substrate against the polishing pad;
detecting in a non-contact manner a temperature of the polishing pad with a temperature sensor at a position where a portion of the polishing pad passes through immediately after the portion has polished the surface of the semiconductor substrate, said detecting step being conducted at different times during said polishing step to obtain a plurality of measured temperatures, the temperature sensor being located on the chuck table and swinging jointly with the swing motion of the chuck table; and
determining an end point of said polishing step based on variations of the measured temperatures.

15. A method according to claim 14, wherein:
said detecting step comprises measuring a first temperature of the polishing pad at a position where the portion of the polishing pad passes immediately before the portion of the polishing pad polishes the surface of the semiconductor substrate and measuring a second temperature of the polishing pad at the position where the portion of the polishing pad passes immediately after the portion of the polishing pad polishes the surface of the semiconductor substrate; and
said determining step comprises detecting the end point of said polishing step based on the difference between the first and second temperatures.

16. A method according to claims 14, wherein the polishing step comprises mounting the polishing pad on a turntable and adjusting a temperature of the turntable so as to become fixed.

17. A method for polishing an insulator film deposited on a semiconductor substrate, said method comprising the steps of:
polishing a surface of the insulator film with a polishing pad to a plane along which recessed portions and protruding portions of the insulator film are arranged;
measuring a temperature of the polishing pad at a position where a portion of the polishing pad passes through immediately after the portion has polished the surface of the insulator film, said measuring step being conducted at different times during said polishing step to obtain measured temperatures; and
detecting an end point of said polishing step based on variations of the measured temperatures.

18. A method according to claim 17, wherein the semiconductor substrate is silicon, and the insulator film is a silicon dioxide film.

19. A method according to claim 17, wherein:
said measuring step comprises measuring a first temperature of the polishing pad at a position where the portion of the polishing pad passes immediately before the portion of the polishing pad polishes the surface of the insulator film and measuring a second temperature of the polishing pad at the position where the portion of the polishing pad passes immediately after the portion of the polishing pad polishes the surface of the insulator film; and
said detecting step comprises detecting the end point of said polishing step based on the difference between the first and second temperatures.

20. A method according to claim 17, wherein the polishing step comprises mounting the polishing pad on a turntable and adjusting a temperature of the turntable so as to become fixed.

21. A method of polishing a material with a polishing pad, said method comprising the steps of:
mounting the polishing pad on a turntable and polishing the material
adjusting a temperature of the turntable during said polishing step so that the temperature of the. turntable becomes fixed; and detecting an end point of the polishing step by detecting a saturated state of an amount of heat generated during said polishing step.

22. A method for polishing a material with a polishing pad, comprising the steps of:

polishing the material, during which a total amount of heat is generated due to said polishing, the total amount of heat being based on the temperature of the polishing pad and a time duration of said polishing step;

measuring a temperature of the polishing pad during said polishing step;

detecting an end point of said polishing step based on a relationship between the total amount of heat generated due to said polishing step and a volume of the material which is removed by the polishing pad during said polishing step.

23. A method for manufacturing a semiconductor substrate, said method comprising the steps of:

providing a substrate comprising first and second semiconductor substrates with an insulator film interposed therebetween, the insulator film having a configuration defined by recesses and protrusions and a polishing rate that is lower than a polishing rate of the first semiconductor substrate;

selectively polishing the first semiconductor substrate with a polishing pad from a surface of the first semiconductor film until the protrusions of the insulator film are exposed such that the insulator film functions as.a stopper;

measuring a temperature of the polishing pad at a position where a portion of the polishing pad passes after the portion has polished the surface of the first semiconductor substrate, said measuring step being conducted at different times during said polishing step to obtain measured temperatures; and detecting an end point of said polishing step based on variations of the measured temperatures.

24. A method for manufacturing a semiconductor substrate, said method comprising the steps of:

providing a substrate comprising first and second semiconductor substrates with an insulator film interposed therebetween, the insulator film having a configuration defined by recesses and protrusions and a polishing rate that is lower than a polishing rate of the first semiconductor substrate;

selectively polishing the first semiconductor substrate with a polishing pad from a surface of the first semiconductor film until the protrusions of the insulator film are exposed such that the insulator film functions as a stopper;

forming a semiconductor device in the first semiconductor substrate in one of the recesses of the, insulator film;

measuring a temperature of the polishing pad at a position where a portion of the polishing pad passes after the portion has polished the surface of the first semiconductor substrate, said measuring step being conducted at different times during said polishing step to obtain measured temperatures; and detecting an end point of said polishing step based on variations of the measured temperatures.

* * * * *